(12) United States Patent
Saito et al.

(10) Patent No.: US 10,715,059 B2
(45) Date of Patent: Jul. 14, 2020

(54) MOTOR DRIVING DEVICE AND FAILURE DETECTING METHOD

(71) Applicant: FANUC CORPORATION, Yamanashi (JP)

(72) Inventors: Sou Saito, Yamanashi-ken (JP); Tsutomu Shikagawa, Yamanashi-ken (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 16/241,094

(22) Filed: Jan. 7, 2019

(65) Prior Publication Data

US 2019/0222150 A1   Jul. 18, 2019

(30) Foreign Application Priority Data

Jan. 12, 2018   (JP) .................. 2018-003153

(51) Int. Cl.
| H02P 3/06 | (2006.01) |
| H02P 29/024 | (2016.01) |
| H02P 5/00 | (2016.01) |
| H02P 3/04 | (2006.01) |
| G01R 31/50 | (2020.01) |
| H02P 6/12 | (2006.01) |

(52) U.S. Cl.
CPC ............... *H02P 3/06* (2013.01); *G01R 31/50* (2020.01); *H02P 3/04* (2013.01); *H02P 5/00* (2013.01); *H02P 6/12* (2013.01); *H02P 29/024* (2013.01); *H02P 29/0241* (2016.02)

(58) Field of Classification Search
CPC .................... H02P 3/06; H02P 6/12

USPC .......................... 318/375, 376, 362
See application file for complete search history.

(56) References Cited

U.S. PATENT DOCUMENTS

| 8,497,641 B2* | 7/2013 | Yamashita ............ G11B 19/20 |
| | | 318/66 |
| 9,093,106 B2* | 7/2015 | Otaguro ................ G11B 19/28 |
| 9,598,064 B2* | 3/2017 | Tanabe .................. F16D 63/002 |

FOREIGN PATENT DOCUMENTS

| JP | H08182365 A | 7/1996 |
| JP | 2000193412 A | 7/2000 |

(Continued)

OTHER PUBLICATIONS

Decision to Grant a Patent issued by the Japanese Patent Office in relation to Japanese Applicaiton No. 2018-003153 dated Oct. 29, 2019 (3 pages) along with English language translation (2 pages).

*Primary Examiner* — David Luo
(74) *Attorney, Agent, or Firm* — Robert P. Michal, Esq.; Carter, DeLuca & Farrell LLP

(57) ABSTRACT

A motor driving device controls braking of multiple motors each having a braking device by using a single brake power supply. The braking device includes: an electromagnetic brake that releases braking of a rotary shaft of the motor by energizing a brake coil; a conductive disk configured to rotate together with the rotary shaft and connected in series with the brake coil; and a plurality of resistors provided on a surface of the disk so as to be periodically connected in series with the brake coil as the disk rotates. The motor driving device identifies a failed braking device of the braking devices, based on the current value of the current flowing from the brake power supply and the rotational positions of the rotary shafts of the multiple motors.

16 Claims, 7 Drawing Sheets

(56) References Cited

FOREIGN PATENT DOCUMENTS

| | | |
|---|---|---|
| JP | 2005126183 A | 5/2005 |
| JP | 2008168981 A | 7/2008 |
| JP | 2016-222372 A | 12/2016 |
| WO | 2017169408 A1 | 10/2017 |

* cited by examiner

FIG. 4

| CONNECTION PATTERN | BRAKING DEVICE 10a | BRAKING DEVICE 10b | BRAKING DEVICE 10c | BRAKE CURRENT Ib |
|---|---|---|---|---|
| 1 | WITH RESISTOR 28 | WITHOUT RESISTOR 28 | WITHOUT RESISTOR 28 | ABOUT 5[A] |
| 2 | WITHOUT RESISTOR 28 | WITH RESISTOR 28 | WITHOUT RESISTOR 28 | ABOUT 5[A] |
| 3 | WITHOUT RESISTOR 28 | WITHOUT RESISTOR 28 | WITH RESISTOR 28 | ABOUT 5[A] |
| 4 | WITHOUT RESISTOR 28 | WITH RESISTOR 28 | WITH RESISTOR 28 | ∞[A] |
| 5 | WITH RESISTOR 28 | WITHOUT RESISTOR 28 | WITH RESISTOR 28 | ∞[A] |
| 6 | WITH RESISTOR 28 | WITH RESISTOR 28 | WITHOUT RESISTOR 28 | ∞[A] |

FIG. 7

| CONNECTION PATTERN | BRAKING DEVICE 10a | BRAKING DEVICE 10b | BRAKING DEVICE 10c | BRAKE CURRENT Ib |
|---|---|---|---|---|
| 1 | WITH RESISTOR 28 | WITHOUT RESISTOR 28 | WITHOUT RESISTOR 28 | ∞[A] |
| 2 | WITHOUT RESISTOR 28 | WITH RESISTOR 28 | WITHOUT RESISTOR 28 | ∞[A] |
| 3 | WITHOUT RESISTOR 28 | WITHOUT RESISTOR 28 | WITH RESISTOR 28 | ∞[A] |
| 4 | WITHOUT RESISTOR 28 | WITH RESISTOR 28 | WITH RESISTOR 28 | ABOUT 5[A] |
| 5 | WITH RESISTOR 28 | WITHOUT RESISTOR 28 | WITH RESISTOR 28 | ABOUT 5[A] |
| 6 | WITH RESISTOR 28 | WITH RESISTOR 28 | WITHOUT RESISTOR 28 | ABOUT 5[A] |
| 7 | WITHOUT RESISTOR 28 | WITHOUT RESISTOR 28 | WITHOUT RESISTOR 28 | ∞[A] |
| 8 | WITH RESISTOR 28 | WITH RESISTOR 28 | WITH RESISTOR 28 | ABOUT 5[A] |

MOTOR DRIVING DEVICE AND FAILURE DETECTING METHOD

CROSS-REFERENCE TO RELATED APPLICATION

This application is based upon and claims the benefit of priority from Japanese Patent Application No. 2018-003153 filed on Jan. 12, 2018, the contents of which are incorporated herein by reference.

BACKGROUND OF THE INVENTION

Field of the Invention

The present invention relates to a motor driving device and a failure detecting method, which can detect failures of a plurality of braking devices provided for a plurality of motors.

Description of the Related Art

Japanese Laid-Open Patent Publication No. 2016-222372 described below discloses an abnormality detecting device that acquires a signal indicating a current flowing through an electromagnetic brake and determines whether or not the electromagnetic brake is in an abnormal state based on the acquired signal.

SUMMARY OF THE INVENTION

In a machine tool or a robot, there are cases where multiple braking devices provided in multiple motors are controlled by a single motor driving device. If, as in the above patent publication, a current sensor is provided and the abnormality detecting function for detecting abnormality of the braking device based on the value of the current flowing through the braking device detected by the current sensor, is provided for each braking device, the cost is increased. For this reason, there has been a demand for sharing a single abnormality detecting function between the braking devices, that is, it has been desired to control multiple braking devices using a single brake power supply and to detect failures of the braking devices based on the current value from the single brake power supply.

Sharing a single abnormality detection function between them allows for detection of abnormality of the braking devices, but since one current sensor detects the current value from the single brake power supply, it is impossible to determine which braking device is abnormal.

It is therefore an object of the present invention to provide a motor driving device and a failure detecting method, which enable identification of a failed braking device even when a single current detector is used to detect the current flowing from one brake power supply to a plurality of braking devices.

A first aspect of the present invention resides in a motor driving device for controlling braking of a plurality of motors each having a braking device by using a single brake power supply, wherein the braking device includes: an electromagnetic brake having a brake coil and configured to release braking of a rotary shaft of the motor by energizing the brake coil; a conductive disk configured to rotate together with the rotary shaft and connected in series with the brake coil; and a plurality of resistors provided on a surface of the disk so that the brake coil is periodically connected in series with each of the resistors, instead of the disk, as the disk rotates. The motor driving device includes: a current detector configured to detect a current value of a brake current flowing from the brake power supply to the multiple brake coils; and a failure identifying unit configured to identify a failed braking device of the braking devices, based on rotational positions of the rotary shafts of the multiple motors and the detected current value.

A second aspect of the present invention resides in a failure detecting method of, with a motor driving device configured to control braking of a plurality of motors each having a braking device by using a single brake power supply, detecting failure of the braking devices, wherein the braking device includes: an electromagnetic brake having a brake coil and configured to release braking of a rotary shaft of the motor by energizing the brake coil; a conductive disk configured to rotate together with the rotary shaft and connected in series with the brake coil; and a plurality of resistors provided on a surface of the disk so that the brake coil is periodically connected in series with each of the resistors, instead of the disk, as the disk rotates. The failure detecting method includes: a current detecting step of detecting a current value of a brake current flowing from the brake power supply to the multiple brake coils; and a failure identifying step of identifying a failed braking device of the braking devices, based on rotational positions of the rotary shafts of the multiple motors and the detected current value.

According to the present invention, it is possible to identify the failed braking device even when the current flowing from the one brake power supply to the multiple braking devices is detected by the single current detector.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 4 is a chart showing an example of the relationships between a connection pattern of the brake coils of three braking devices and the detected brake current;

FIG. 7 is a diagram showing an example of the relationships between the connection patterns of the brake coils of three braking devices and the detected brake current in a modified example.

DESCRIPTION OF THE PREFERRED EMBODIMENTS

A motor driving device and a failure detecting method according to the present invention will be detailed below by describing preferred embodiments with reference to the accompanying drawings.

EMBODIMENT

Figure 1:
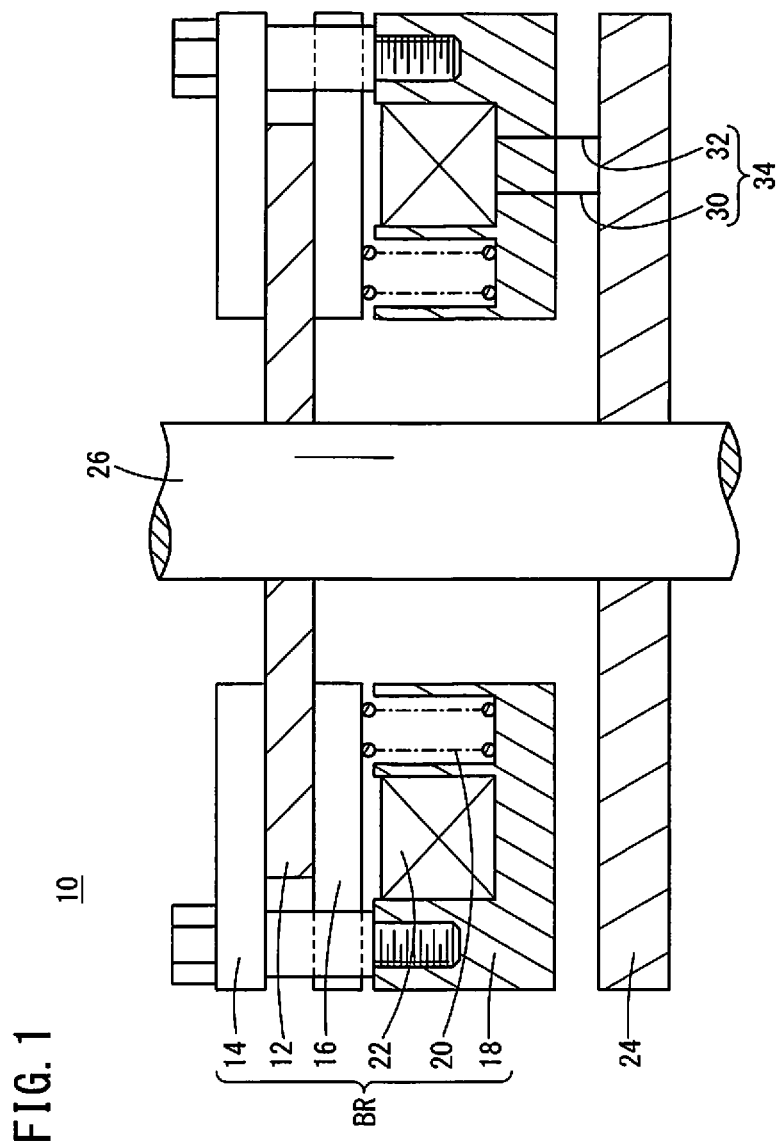
FIG. 1 is a diagram showing a schematic configuration of a braking device used in an embodiment of the present invention.

FIG. 1 is a diagram showing a schematic configuration of a braking device 10 used in the embodiment. The braking device 10 includes a friction plate 12, an end plate 14, an armature 16, a core 18, a spring 20, a brake coil 22 and a disk 24. The friction plate 12, the end plate 14, the armature 16, the core 18, the spring 20 and the brake coil 22 form an electromagnetic brake BR.

Figure 3:
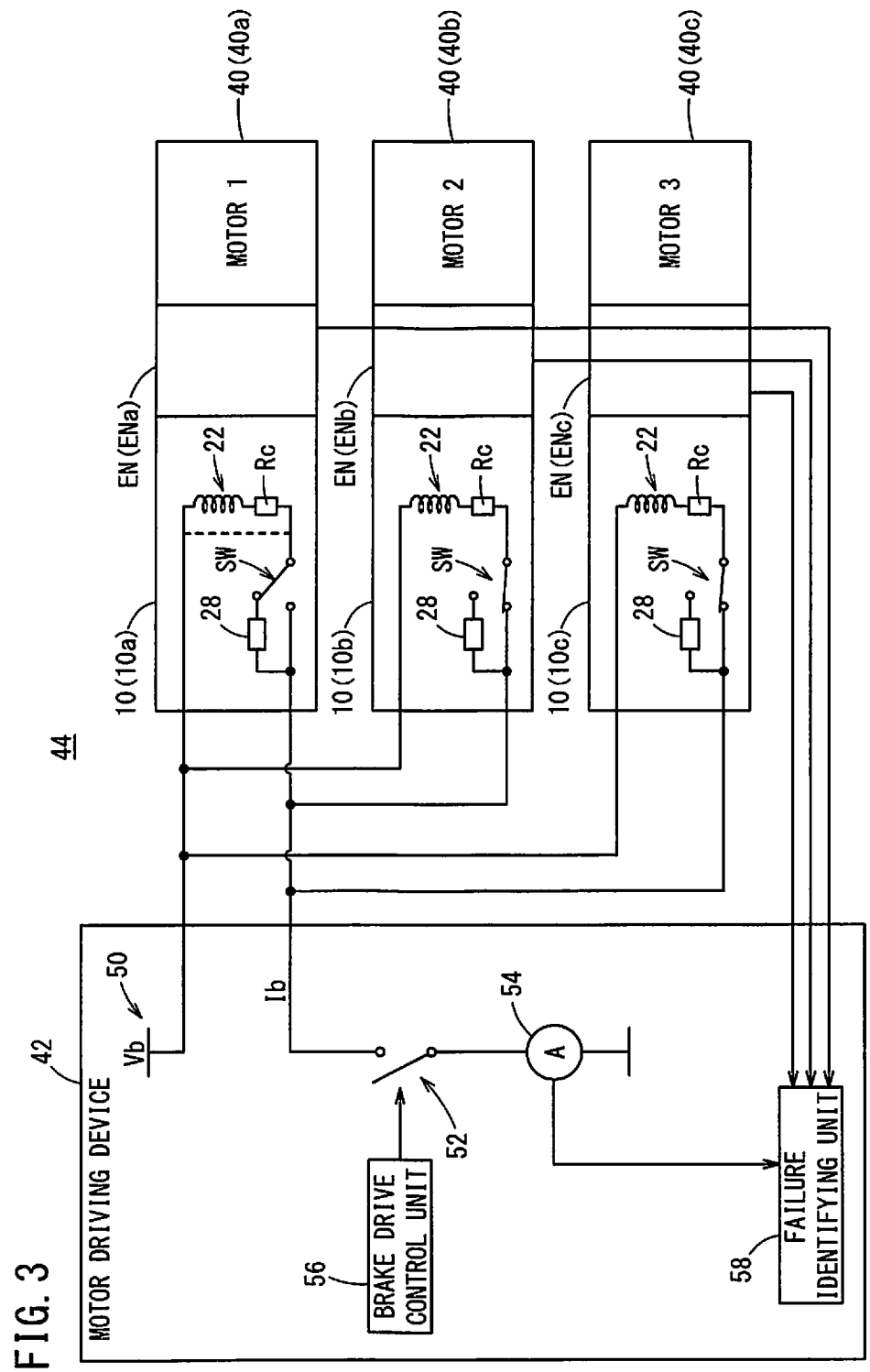
FIG. 3 is a diagram showing an overall configuration of a motor drive system including a plurality of motors each provided with the braking device shown in FIG. 1 and a single motor driving device for controlling the multiple motors.

The friction plate 12 is attached to a rotary shaft 26 of a motor 40 shown in FIG. 3 and rotates together with the rotary shaft 26 about the rotary shaft 26. The friction plate 12 is arranged between the end plate 14 and the armature 16. The core 18 is provided on the opposite side from the friction plate 12 across the armature 16. The spring 20 is provided in the core 18 so as to urge the armature 16 toward the friction plate 12. The urging force of the spring 20 causes the friction plate 12 to be held and sandwiched between the end plate 14 and the armature 16, to thereby brake the rotation of the friction plate 12 (the rotary shaft 26).

The brake coil 22 is provided in the core 18. The core 18 and the brake coil 22 form an electromagnet. Magnetic force is generated by energizing the brake coil 22. As the magnetic attraction force overcomes the urging force of the spring 20, the armature 16 is attracted to the core 18. As a result, the friction plate 12 is freed, so that the friction plate 12 (the rotary shaft 26) can rotate.

The disk 24 is attached to the rotary shaft 26 and rotates together with the rotary shaft 26 about the rotary shaft 26. The disk 24 is formed of a conductive material and is connected in series with the brake coil 22. In the present embodiment, for easy understanding, the resistance value of the disk 24 is assumed to be 0 [Ω].

Figure 2:
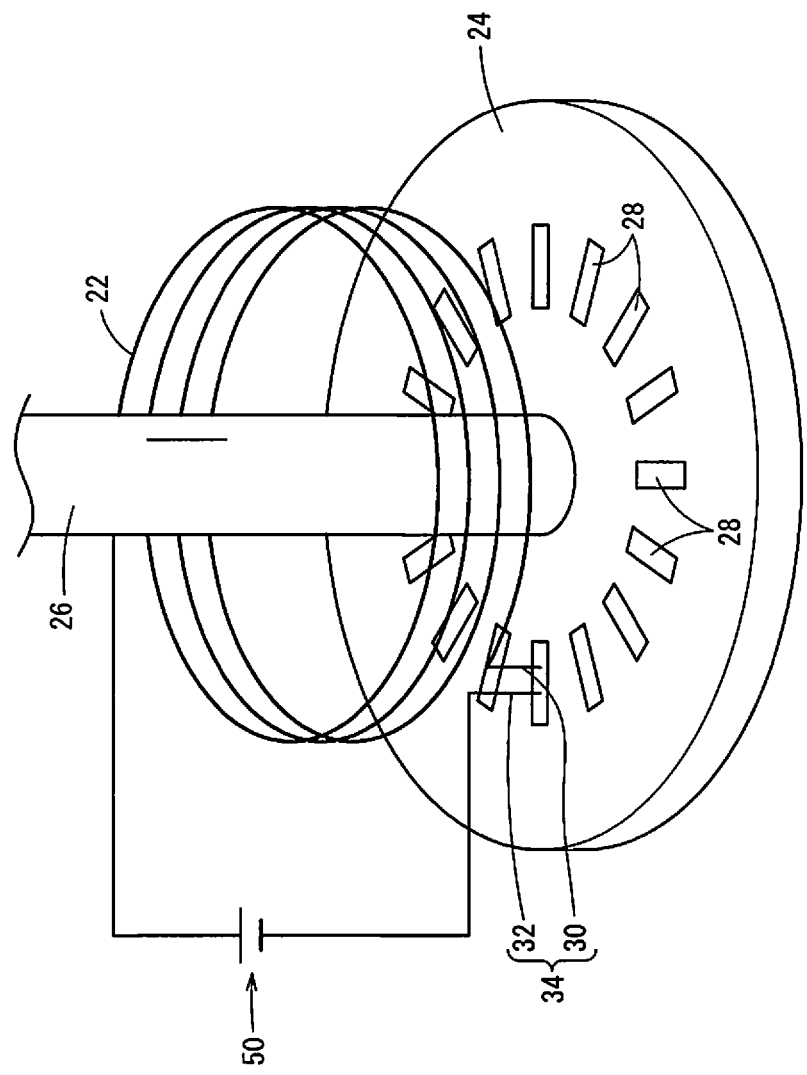
FIG. 2 is a diagram showing a specific configuration of the disk shown in FIG. 1.

FIG. 2 is a diagram showing a specific configuration of the disk 24. The disk 24 has, on a surface thereof, a plurality of resistors 28. The multiple resistors 28 are provided so as to be periodically connected in series with the brake coil 22 as the disk 24 turns. For example, the multiple resistors 28 are provided at intervals of 20 degrees so that the brake coil 22 is connected in series with the resistor 28 as the disk 24 turns 20 degrees. As a result, each of the multiple resistors 28 is periodically connected in series with the brake coil 22. Rotation of the disk 24 switches between a state in which the brake coil 22 is directly connected in series with the disk 24 and a state in which the brake coil 22 is connected in series with the resistor 28.

In the example shown in FIG. 2, one end of the brake coil 22 is connected to the positive terminal of a brake power supply 50 (see FIG. 3) while the other end of the brake coil 22 is connected to a positive contact 30 that is put into contact with either the disk 24 or the resistor 28. A negative contact 32 that is put into contact with either the disk 24 or the resistor 28 is connected to the negative terminal of the brake power supply 50. A contact portion 34 formed of the positive contact 30 and the negative contact 32 contacts either the disk 24 or the resistor 28.

FIG. 3 is a diagram showing an overall configuration of a motor drive system 44 including a plurality of motors 40 each having the braking device 10 described with FIGS. 1 and 2 and one motor driving device 42 for controlling the multiple motors 40. The motor driving device 42 brakes the multiple motors 40 using the multiple braking devices 10 provided for respective multiple motors 40. Each of the multiple motors 40 is provided with an encoder (rotational position detector) EN for detecting the rotational position of the rotary shaft 26 of the motor 40.

For easy understanding, the present embodiment will be described with a configuration including three motors 40. Therefore, the number of braking devices 10 used is also three. In order to distinguish the three motors 40 from each other, the three motors 40 may be referred to as 40a, 40b and 40c. Also, the braking device 10 and encoder EN provided in the motor 40a may be referred to as 10a and ENa; the braking device 10 and encoder EN provided in the motor 40b may be referred to as 10b and ENb; and the braking device 10 and encoder EN provided in the motor 40c may be referred to as 10c and ENc.

In FIG. 3, a switch SW for switching between connecting the brake coil 22 to the resistor 28 and disconnecting the brake coil 22 from the resistor is illustrated in each braking device 10 (10a to 10c). However, this switch is conceptually illustrated in order to show, as a constituent element, the function in which the connection destination of the brake coil 22 changes as the disk 24 turns. That is, as the disk 24 rotates, the connection state of the brake coil 22 is switched, by turns, between series connection directly with the disk 24 and series connection with the resistor 28. Since the resistance value of the disk 24 is assumed to be zero, the illustration of the disk 24 is omitted in FIG. 3. In addition, a resistor Rc shown in FIG. 3 merely represents the resistance of the brake coil 22 (which, hereinafter, may be referred to as a brake coil resistance), and is not actually provided.

The motor driving device 42 includes the brake power supply 50, a switch 52, a current detector 54, a brake drive control unit 56 and a failure identifying unit 58.

The brake power supply 50 is a DC (direct current) power supply for supplying current to each of the brake coils 22 of the three braking devices 10 (10a to 10c). The switch 52 switches whether or not to supply a brake current Ib from the brake power supply 50 to the brake coils 22 of the three braking devices 10 (10a to 10c). The current detector 54 detects the current value of the brake current Ib flowing from the brake power supply 50 to the three brake coils 22. The current value of the brake current Ib detected by the current detector 54 is the sum of all the currents flowing respectively through the three brake coils 22.

The brake drive control unit 56 controls the switch 52 to control the three braking devices 10 (10a to 10c). The brake drive control unit 56 turns on the switch 52 when releasing the braking of the three motors 40 (40a to 40c). As a result, the brake current Ib is supplied from the single brake power supply 50 to the brake coils 22 of the three braking devices 10 (10a to 10c), so that the rotary shafts 26 of the three motors 40 (40a to 40c) can rotate. When braking the three motors 40 (40a to 40c), the brake drive control unit 56 turns off the switch 52. As a result, the supply of the brake current Ib to the brake coils 22 of the three braking devices 10 (10a to 10c) is cut off so that the rotary shafts 26 of the three motors 40 (40a to 40c) are braked.

Based on the rotational positions of the rotary shafts 26 of the three motors 40 (40a to 40c) and the current value detected by the current detector 54, the failure identifying unit 58 identifies a failed braking device 10 (which may be hereinafter referred to as a failed braking device 10F in some cases). The failure identifying unit 58 determines whether or not the current value of the brake current Ib is greater than a threshold value TH. When the current value is greater than the threshold value TH, the failure identifying unit 58 determines a failed braking device 10F based on the rotational positions of the rotary shafts 26 of the multiple motors 40 (40a to 40c). The method of identifying the failed braking device 10F will be described later in detail.

Here, the failure identifying unit 58 recognizes the rotational positions of the rotary shafts 26 of the three motors 40 (40a to 40c) based on the detection signals from the three encoders EN (ENa to ENc) provided respectively in the three motors 40 (40a to 40c).

Now, how the failure identifying unit 58 identifies the failed braking device 10F will be specifically described. The failure identifying unit 58, based on the rotational positions of the rotary shafts 26 of the three motors 40, determines whether or not each of the brake coils 22 of the three braking devices 10 is connected in series with the resistor 28. This enables the failure identifying unit 58 to recognize a connection pattern of the brake coils 22 of the three braking devices 10. The failure identifying unit 58 identifies the failed braking device 10F based on the recognized connection pattern and the current value detected by the current detector 54.

Here, the resistance value of the resistor 28 is set to a value sufficiently smaller than the resistance value of the brake coil resistor Rc. In the embodiment, the resistance value of the brake coil resistor Rc is 200 [Ω], and the resistance value of the resistor 28 is 5 [Ω]. The voltage, of the brake power supply 50, designated at Vb, is 24 [V].

When none of the brake coils 22 of all the braking devices 10 (10a to 10c) is connected to the resistor 28 (i.e., when all the brake coils 22 are directly connected to the disks 24), the current flowing through each of the three braking devices 10 (10a to 10c) is Vb/Rc. Therefore, the brake current Ib is Ib=(Vb/Rc)×3. When the above numerical values are substituted into this equation, Ib=(24 [V]/200 [Ω])×3=0.36 [A]. Since the resistance value of the resistor 28 is sufficiently smaller than that of the brake coil resistor Rc, even if the brake coil 22 is connected to the resistor 28, no large difference will occur in the current value detected by the current detector 54.

Here, the braking device 10 often fails due to the short circuit of the brake coil 22. In FIG. 3, the broken line shows a state in which the brake coil 22 of the braking device 10a is short-circuited.

For example, as shown in FIG. 3, when the brake coil 22 of the braking device 10a is short-circuited in a state where the brake coil 22 of the braking device 10a is connected to the resistor 28, the current flowing through the braking device 10a is 24 [V]/5 [Ω]=4.8 [A]. Accordingly, the brake current Ib is 4.8 [A] or greater.

On the other hand, when the brake coil 22 of the braking device 10a is short-circuited in a state where the brake coil 22 of the braking device 10a is not connected to the resistor 28 (i.e., a state where the brake coil 22 is directly connected to the disk 24), the current flowing through the braking device 10a is 24 [V]/0 [Ω]=∞ [A]. Therefore, the brake current Ib is ∞ [A].

The failure identifying unit 58 has a first threshold value TH1 corresponding to the braking device 10 that is in a state where the brake coil 22 is connected to the resistor 28 and a second threshold value TH2 corresponding to the braking device 10 that is in a state where the brake coil 22 is directly connected to the disk 24. The second threshold value TH2 is different from the first threshold value TH1.

This first threshold value TH1 is greater than the brake current Ib (0.36 [A]) when all the braking devices 10 (10a to 10c) are normal, and is smaller than the brake current Ib when one braking device 10 has failed (i.e., the brake coil 22 is short-circuited). In the present embodiment, the first threshold value TH1 is set at 4 [A].

The second threshold value TH2 is set at a value greater than the brake current Ib (4.8 [A]×3=14.4 [A]) when the brake coils 22 of all the braking devices 10 are connected to the respective resistors 28 and all the braking devices 10 are out of order (i.e., all the brake coils 22 are short-circuited). In the present embodiment, the second threshold value TH2 is set at 20 [A] Therefore, the first threshold value TH1 and the second threshold value TH2 have a relationship of TH1<TH2.

The failure identifying unit 58 identifies, as the failed braking device 10F, a braking device 10 corresponding to a threshold value TH that is smaller than and closest to the current value detected by the current detector 54, from among the first and second threshold values TH1 and TH2. Here, the failure identifying unit 58 determines which braking device 10 among the three braking devices 10 (10a to 10c) is the braking device 10 corresponding to such a threshold value TH, based on the recognized connection pattern.

For example, when the detected current value is about 5 [A], the threshold value TH lower than 5 [A] is the first threshold value TH1, so that the failure identifying unit 58 determines that a braking device 10 whose brake coil 22 is connected to the resistor 28 is in failure. On the other hand, when the detected current value is ∞ [A], the threshold value TH which is lower than ∞ [A] and closest to ∞ [A] is the second threshold value TH2, so that the failure identifying unit 58 determines that a braking device 10 whose brake coil 22 is not connected to the resistor 28 is in failure.

FIG. 4 is a chart showing an example of the relationships between the connection pattern of the brake coils 22 of the three braking devices 10 (10a to 10c) and the detected brake current Ib. Here in FIG. 4, "with the resistor 28" indicates that the resistor 28 is connected in series with the brake coil 22, whereas "without the resistor 28" indicates that no resistor 28 is connected to the brake coil 22 or the brake coil 22 is directly connected to the disk 24.

In the connection patterns 1 to 3, since the current value detected by the current detector 54 is about 5 [A], a braking device 10 whose brake coil 22 is connected to the resistor 28 is considered to be in failure. Accordingly, in the case of the connection pattern 1, the failure identifying unit 58 identifies the braking device 10a as the failed braking device 10F. Similarly, the failure identifying unit 58 identifies the braking device 10b as the failed braking device 10F in the case of the connection pattern 2, and identifies the braking device 10c as the failed braking device 10F in the case of the connection pattern 3.

In the connection patterns 4 to 6, since the current value detected by the current detector 54 is ∞ [A], the braking device 10 whose brake coil 22 is not connected to the resistor 28 is determined to be in failure. Accordingly, in the case of the connection pattern 4, the failure identifying unit 58 identifies the braking device 10a as the failed braking device 10F. Similarly, the failure identifying unit 58 identifies the braking device 10b as the failed braking device 10F in the case of the connection pattern 5, and identifies the braking device 10c as the failed braking device 10F in the case of the connection pattern 6.

Next, the operation of the motor driving device 42 will be described with reference to the flowchart shown in FIG. 5. At step S1, the brake drive control unit 56 turns on the switch 52 so as to supply current to the brake coils 22 in the multiple braking devices 10 (10a to 10c). As a result of energization of the brake coils 22, the brakes on the motors 40 in which the braking devices 10 are not failed are released.

Next, at step S2 the failure identifying unit 58 obtains the current value of the brake current Ib detected by the current detector 54.

Then, at step S3 the failure identifying unit 58 obtains the rotational positions of the rotary shafts 26 of the multiple motors 40 (40a to 40c) from the multiple encoders EN (ENa to ENc).

At step S4, the failure identifying unit 58 identifies the failed braking device 10F based on the current value acquired at step S2 and the rotational positions of the rotary shafts 26 of the multiple motors 40 acquired at step S3 Then, the control is terminated.

Next, the detailed operation of step S4 in FIG. 5 will be described with reference to the flowchart shown in FIG. 6. As the control proceeds to step S4 in FIG. 5, at step S11 of FIG. 6, the failure identifying unit 58 recognizes, based on the rotational positions of the rotary shafts 26 of the multiple motors 40 obtained at step S3 of FIG. 5, the connection pattern of the brake coils 22 of the multiple braking devices 10 (10a to 10c).

Figure 5:
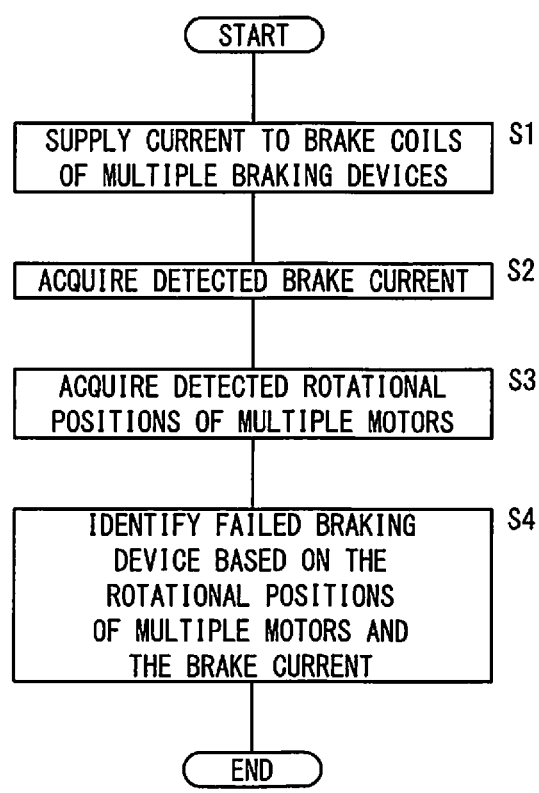
FIG. 5 is a flowchart showing the operation of the motor driving device shown in FIG. 3.
Figure 6:
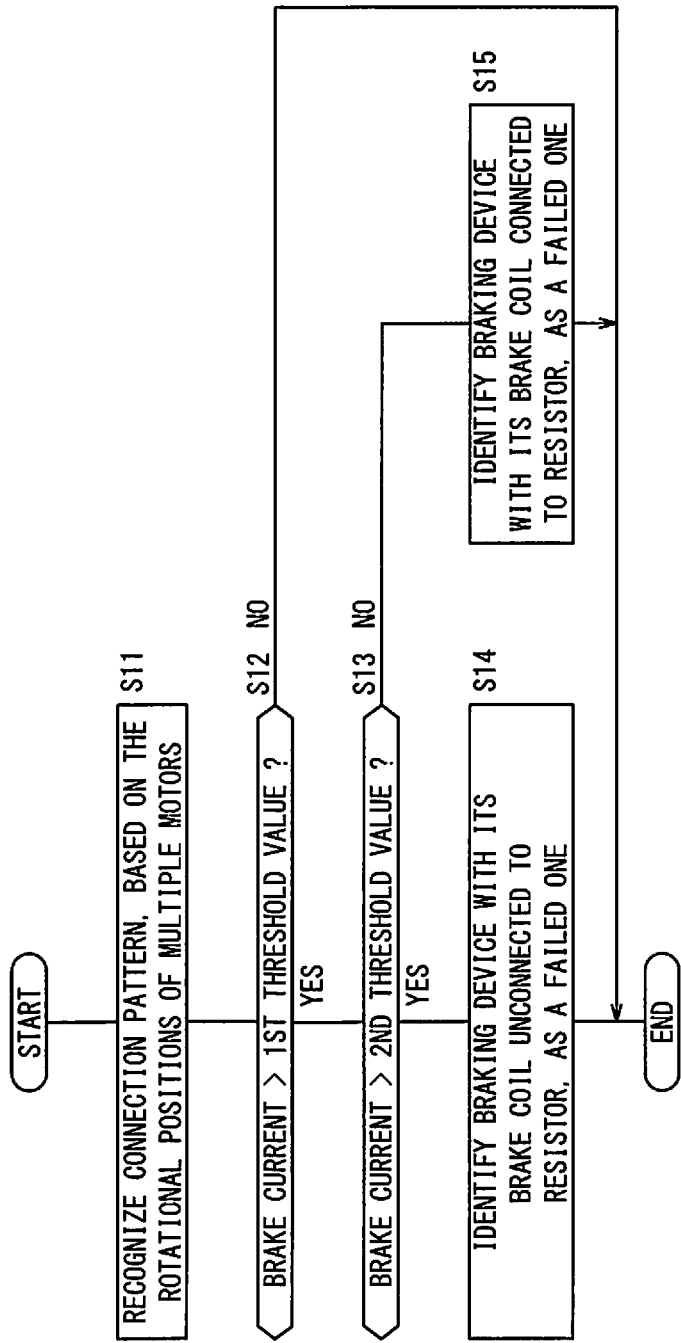
FIG. 6 is a flowchart showing the detailed operation at step S4 of FIG. 5.

Then, at step S12 the failure identifying unit 58 determines whether or not the current value of the brake current Ib acquired at step S2 of FIG. 5 is greater than the first threshold value TH1. If the acquired current value of the brake current Ib, at step S12, is determined to be greater than the first threshold value TH1, the control proceeds to step S13. On the other hand, when it is judged that the acquired current value of the brake current Ib, at step S12, is not greater than the first threshold value TH1, the control is ended at this point because there is no failure in the braking devices 10.

At step S13, the failure identifying unit 58 determines whether or not the acquired current value of the brake current Ib is greater than the second threshold value TH2.

At step S13, the current value of the acquired brake current Ib is determined to be greater than the second threshold value TH2, the control proceeds to step S14. At step S14, the failure identifying unit 58 identifies the braking device 10 whose brake coil 22 is not connected to the resistor 28, as the failed braking device 10F, and the control is terminated. Here, the failure identifying unit 58, based on the connection pattern recognized at step S11, determines which braking device 10 has a brake coil 22 that is not connected to the resistor 28, among the three braking devices 10 (10a to 10c).

On the other hand, when it is determined at step S13 that the current value of the acquired brake current Ib is not greater than the second threshold value TH2, the control goes to step S15. At step S15, the failure identifying unit 58 identifies the braking device 10 whose brake coil 22 is connected to the resistor 28, as the failed braking device 10F, and the control is terminated. Here, the failure identifying unit 58, based on the connection pattern recognized at step S11, determines which braking device 10 has a brake coil 22 that is connected to the resistor 28, among the three braking devices 10 (10a to 10c).

In this way, it is possible to identify the failed braking device 10 even when the current flowing from one brake power supply 50 to the multiple braking devices 10 is detected by the single current detector 54.

[Modified Example]

FIG. 7 is a chart showing an example of the relationships between the connection pattern of the brake coils 22 of the three braking devices 10 (10a to 10c) and the detected brake current Ib. Similarly to FIG. 4, in FIG. 7, "with the resistor 28" indicates that the resistor 28 is connected in series with the brake coil 22, whereas "without the resistor 28" indicates that no resistor 28 is connected to the brake coil 22.

In the connection patterns 1 to 3, unlike FIG. 4, since the detected current value is ∞ [A], a braking device 10 whose brake coil 22 is not connected to the resistor 28 is considered to be in failure. However, in the connection patterns 1 to 3, there are two braking devices 10 whose brake coil 22 is not connected to the resistor 28. Therefore, it is possible to narrow down the candidates for the failed braking device 10 (it is possible to specify it to some extent), but it is impossible to definitively identify the failed braking device 10.

Also in the connection patterns 4 to 6, the detected current value is about 5 [A], but there are two braking devices 10 whose brake coil 22 is connected to the resistor 28, unlike FIG. 4. Therefore, it is possible to narrow down the candidates for the failed braking device 10 (it is possible to specify it to some extent), but it is impossible to definitively identify the failed braking device 10.

In a connection pattern 7, the detected current value is ∞ [A], but none of the brake coils 22 of all the braking devices 10 (10a to 10c) are connected to the resistor 28, so that it is impossible to identify the failed braking device 10. Similarly, in a connection pattern 8, the detected current value is about 5 [A], every brake coil 22 of all the braking devices 10 (10a to 10c) is connected to the resistor 28, so that it is impossible to identify the failed braking device 10.

To deal with this, in the modified example, the resistance values of the disks 24 of the braking devices 10 are made different from one another. This makes it possible to differentiate the current value of the brake current Ib flowing through each braking device 10 when the brake coil 22 is short-circuited in a state that the brake coil 22 is directly connected to the disk 24, from those of other braking devices. In this case, the second threshold values TH2 of the braking devices 10 are made different depending on the resistance values of the disks 24.

Further, in the modified example, the resistance value of the resistors 28 provided on the disk 24 of each braking device 10 is set to be different for each of the braking devices. Owing thereto, it is possible to make the current value of the brake current Ib flowing through each braking device 10 when the brake coil 22 is short-circuited in a state that the brake coil 22 is connected to the resistor 28, different for each of the braking devices. In this case, the first threshold value TH1 is made different for each braking device 10, depending on the resistance value of the resistor 28.

The disks 24 of the multiple braking devices 10 and the resistors 28 provided on the disks 24 of the multiple braking devices 10 should have different resistance values. In the case that the disk 24 and the resistor 28 have the same resistance value, when the braking device 10 fails, the detected current value of the brake current Ib flowing through the disk cannot be distinguished from that of the resistor. As a result, it is impossible to determine whether a failed braking device is the braking device 10 having its brake coil 22 connected to the resistor 28 or the braking device 10 having its brake coil 22 not connected to the resistor 28. Incidentally, since the disks 24 of the multiple braking devices 10 and the resistors 28 provided on the disks 24 of the multiple braking devices 10 have different resistance values, the multiple first threshold values TH1 and the multiple second threshold values TH2 are set to be different from each other.

The failure identifying unit 58 identifies, as the failed braking device 10F, a braking device 10 corresponding to a threshold value TH that is smaller than and closest to the current value of the brake current Ib detected by the current detector 54, from among the multiple first threshold values TH1 and the multiple second threshold values TH2.

This makes it possible to definitively identify the failed braking device 10 even in the relationship between the connection pattern of the brake coils 22 of the three braking devices 10 (10a to 10c) and the detected brake current Ib as shown in FIG. 7.

In the above example, the resistance value of the disk 24 in each braking device 10 is made different for each of the braking devices 10 and the resistance value of the resistors 28 provided on the disk 24 of each braking device 10 is made different for each of the braking devices 10. However, only the resistance value of the disk or only the resistance value of the resistors on the disk may be different for each of the braking devices 10.

For example, the resistance value of the disk 24 of each braking device 10 may be different for each of the braking devices 10 while the resistors 28 provided on the disks 24 may have the same resistance value in all the multiple braking devices 10. In this case, the second threshold value TH2 is made different for each braking device 10, and the first threshold value TH1 has a single value. Therefore, the failure identifying unit 58 identifies, as the failed braking device 10F, a braking device 10 corresponding to a threshold value TH that is smaller than and closest to the current value of the brake current Ib detected by the current detector 54, from among the first threshold value TH1 and the multiple second threshold values TH2.

In this case, it is possible to identify the failed braking device 10F even when there are multiple braking devices 10, whose brake coils 22 are directly connected to the respective disks 24, and one of the braking devices 10 is in failure.

Conversely, the resistance value of the resistors 28 provided on the disk 24 of each braking device 10 may be different for each of the braking devices 10 while the disks 24 may have the same resistance value in all the multiple braking devices 10. In this case, the first threshold value TH1 is made different for each braking device 10, and the second threshold value TH2 has a single value. Therefore, the failure identifying unit 58 identifies, as the failed braking device 10F, a braking device 10 corresponding to a threshold value TH that is smaller than and closest to the current value of the brake current Ib detected by the current detector 54, from among the multiple first threshold values TH1 and the second threshold value TH2.

In this case, it is possible to identify the failed braking device 10F even when there are multiple braking devices 10 whose brake coils 22 are connected to the respective resistors 28 and one of the braking devices 10 is in failure.

[Technical Idea Obtained from Embodiment]

Technical ideas that can be grasped from the above embodiment and modifications are described below.

<First Technical Idea>

The motor driving device (42) controls braking of a plurality of motors (40) each having a braking device (10) by using a single brake power supply (50). The braking device (10) includes: an electromagnetic brake (BR) having a brake coil (22) and configured to release the braking of a rotary shaft (26) of the motor (40) by energizing the brake coil (22); a conductive disk (24) configured to rotate together with the rotary shaft (26) and connected in series with the brake coil (22); and a plurality of resistors (28) provided on a surface of the disk (24) so that the brake coil (22) is periodically connected in series with each of the resistors, instead of the disk (24), as the disk (24) rotates. The motor driving device (42) includes: a current detector (54) configured to detect the current value of a brake current (Ib) flowing from the brake power supply (50) to the multiple brake coils (22); and a failure identifying unit (58) configured to identify a failed braking device (10) of the braking devices, based on the rotational positions of the rotary shafts (26) of the multiple motors (40) and the detected current value.

Thereby, it is possible to identify the failed braking device (10) even when the current flowing from the one brake power supply (50) to the multiple braking devices (10) is detected by the single current detector (54).

The failure identifying unit (58) may be configured to determine whether or not the current value is greater than a threshold value (TH), and when the current value is greater than the threshold value (TH), identify the failed braking device (10), based on the rotational positions of the rotary shafts (26) of the multiple motors (40). This makes it possible to identify the failed braking device (10).

The failure identifying unit (58) may be configured to determine whether each of the brake coils (22) of the multiple braking devices (10) is directly connected in series with the disk (24) or is connected in series with the resistor (28), based on the rotational positions of the rotary shafts (26) of the multiple motors (40), to thereby recognize the connection pattern of the brake coils (22) of the multiple braking devices (10), and identify the failed braking device (10), based on the recognized connection pattern and the current value. This makes it possible to identify the failed braking device (10).

The failure identifying unit (58) may have a first threshold value (TH1) corresponding to the braking device (10) whose brake coil (22) is connected to the resistor (28) and a second threshold value (TH2) corresponding to the braking device (10) whose brake coil (22) is directly connected to the disk (24), the second threshold value being different from the first threshold value (TH1), and the failure identifying unit may be configured to identify, as the failed braking device, the braking device (10) corresponding to a threshold value (TH) that is smaller than and closest to the current value, among the first threshold value (TH1) and the second threshold value (TH2). This makes it possible to identify the failed braking device (10).

The resistance value of the resistors (28) provided on the disk (24) may be different for each of the braking devices (10). The first threshold value of the failure identifying unit (58) may comprise a plurality of different first threshold values (TH1) that each correspond to the resistance value of the resistors (28) provided on each of the disks (24) of the multiple braking devices (10), and the failure identifying unit may be configured to identify, as the failed braking device, the braking device (10) corresponding to a threshold value (TH) that is smaller than and closest to the current value, among the multiple first threshold values (TH1) and the second threshold value (TH2). With the above configuration, it is possible to identify the failed braking device (10) even when there are multiple braking devices (10) whose brake coils (22) are each connected to the resistor (28).

The resistance value of the disk (24) may be different for each of the braking devices (10). The second threshold value of the failure identifying unit (58) may comprise a plurality of different second threshold values (TH2) that each correspond to the resistance value of each of the disks (24) of the multiple braking devices (10), and the failure identifying unit may be configured to identify, as the failed braking device, the braking device (10) corresponding to a threshold value (TH) that is smaller than and closest to the current value, among the first threshold value (TH1) and the multiple second threshold values (TH2). With this configuration, it is possible to identify the failed braking device (10) even when there are multiple braking devices (10) whose brake coils (22) are connected directly to the respective disks (24).

The failure identifying unit (58) may have a first threshold value (TH1) corresponding to the braking device (10) whose brake coil (22) is connected to the resistor (28) and a second threshold value (TH2) corresponding to the braking device (10) whose brake coil (22) is directly connected to the disk (24), the second threshold value being greater than the first threshold value (TH1), and the failure identifying unit may be configured to, if the current value is greater than the first threshold value (TH1) and equal to or smaller than the second threshold value (TH2), identify the braking device (10) whose brake coil (22) is connected to the resistor (28), as the failed braking device, and if the current value is greater than the second threshold value (TH2), identify the braking device (10) whose brake coil (22) is directly connected to the disk (24), as the failed braking device. This makes it possible to identify the failed braking device (10).

<Second Technical Idea>

A failure detecting method is a method of, with a motor driving device (42) configured to control braking of a plurality of motors (40) each having a braking device (10) by using a single brake power supply (50), detecting failure of the braking devices (10). The braking device (10) includes: an electromagnetic brake (BR) having a brake coil (22) and configured to release the braking of a rotary shaft (26) of the motor (40) by energizing the brake coil (22); a conductive disk (24) configured to rotate together with the rotary shaft (26) and connected in series with the brake coil (22); and a plurality of resistors (28) provided on a surface of the disk (24) so that the brake coil (22) is be periodically connected in series with each of the resistors, instead of the disk (24), as the disk (24) rotates. The failure detecting method includes: a current detecting step of detecting the current value of a brake current (Ib) flowing from the brake power supply (50) to the multiple brake coils (22); and a failure identifying step of identifying a failed braking device (10) of the braking devices, based on the rotational positions of the rotary shafts (26) of the multiple motors (40) and the detected current value.

Owing thereto, it is possible to identify the failed braking device (10) even when the current flowing from the one brake power supply (50) to the multiple braking devices (10) is detected by the single current detector (54).

The failure identifying step may determine whether or not the current value is greater than a threshold value (TH), and when the current value is greater than the threshold value (TH), identify the failed braking device (10), based on the rotational positions of the rotary shafts (26) of the multiple motors (40). This method makes it possible to identify the failed braking device (10).

The failure identifying step may determine whether each of the brake coils (22) of the multiple braking devices (10) is directly connected in series with the disk (24) or is connected in series with the resistor (28), based on the rotational positions of the rotary shafts (26) of the multiple motors (40), to thereby recognize the connection pattern of the brake coils (22) of the multiple braking devices (10), and may identify the failed braking device (10), based on the recognized connection pattern and the current value. This method makes it possible to identify the failed braking device (10).

The failure identifying step may have a first threshold value (TH1) corresponding to the braking device (10) whose brake coil (22) is connected to the resistor (28) and a second threshold value (TH2) corresponding to the braking device (10) whose brake coil (22) is directly connected to the disk (24), the second threshold value being different from the first threshold value (TH1), and the failure identifying step may identify, as the failed braking device, the braking device (10) corresponding to a threshold value (TH) that is smaller than and closest to the current value, among the first threshold value (TH1) and the second threshold value (TH2). This method makes it possible to identify the failed braking device (10).

The resistance value of the resistors (28) provided on the disk (24) may be different for each of the braking devices (10). The first threshold value of the failure identifying step may comprise a plurality of different first threshold values (TH1) that each correspond to the resistance value of the resistors (28) provided on each of the disks (24) of the multiple braking devices (10), and the failure identifying step may identify, as the failed braking device, the braking device (10) corresponding to a threshold value (TH) that is smaller than and closest to the current value, among the multiple first threshold values (TH1) and the second threshold value (TH2). With this configuration, it is possible to identify the failed braking device (10) even when there are multiple braking devices (10) whose brake coils (22) are each connected to the resistor (28).

The resistance value of the disk (24) may be different for each of the braking devices (10). The second threshold value of the failure identifying step may comprise a plurality of different second threshold values (TH2) that each correspond to the resistance value of each of the disks (24) of the multiple braking devices (10), and the failure identifying step may identify, as the failed braking device, the braking device (10) corresponding to a threshold value (TH) that is smaller than and closest to the current value, among the first threshold value (TH1) and the multiple second threshold values (TH2). Owing to the above, it is possible to identify the failed braking device (10) even when there are multiple braking devices (10) whose brake coils (22) are connected directly to the respective disks (24).

The failure identifying step may have a first threshold value (TH1) corresponding to the braking device (10) whose brake coil (22) is connected to the resistor (28) and a second threshold value (TH2) corresponding to the braking device (10) whose brake coil (22) is directly connected to the disk (24), the second threshold value being greater than the first threshold value (TH1). If the current value is greater than the first threshold value (TH1) and equal to or smaller than the second threshold value (TH2), the failure identifying step may identify the braking device (10) whose brake coil (22) is connected to the resistor (28) as the failed braking device, and if the current value is greater than the second threshold value (TH2), the failure identifying step may identify the braking device (10) whose brake coil (22) is directly connected to the disk (24), as the failed braking device. As a result, it is possible to identify the failed braking device (10).

The present invention is not particularly limited to the embodiments described above, and various modifications are possible without departing from the essence and gist of the present invention.

What is claimed is:

1. A motor driving device for controlling braking of a plurality of motors each having a braking device by using a single brake power supply, wherein the braking device includes: an electromagnetic brake having a brake coil and configured to release braking of a rotary shaft of the motor by energizing the brake coil; a conductive disk configured to rotate together with the rotary shaft and connected in series with the brake coil; and a plurality of resistors provided on a surface of the disk so that the brake coil is periodically connected in series with each of the resistors, instead of the disk, as the disk rotates, the motor driving device comprising:
- a current detector configured to detect a current value of a brake current flowing from the brake power supply to the multiple brake coils; and
- a failure identifying unit configured to identify a failed braking device of the braking devices, based on rotational positions of the rotary shafts of the multiple motors and the detected current value, wherein the failure identifying unit is configured to determine whether or not the current value is greater than a threshold value, and when the current value is greater than the threshold value, identify the failed braking device, based on the rotational positions of the rotary shafts of the multiple motors.

2. The motor driving device according to claim 1, wherein the failure identifying unit is configured to determine whether each of the brake coils of the multiple braking devices is directly connected in series with the disk or is connected in series with the resistor, based on the rotational positions of the rotary shafts of the multiple motors, to thereby recognize a connection pattern of the brake coils of the multiple braking devices, and identify the failed braking device, based on the recognized connection pattern and the current value.

3. A failure detecting method of, with a motor driving device configured to control braking of a plurality of motors each having a braking device by using a single brake power supply, detecting failure of the braking devices, wherein the braking device includes: an electromagnetic brake having a brake coil and configured to release braking of a rotary shaft of the motor by energizing the brake coil; a conductive disk configured to rotate together with the rotary shaft and connected in series with the brake coil; and a plurality of resistors provided on a surface of the disk so that the brake coil is periodically connected in series with each of the resistors, instead of the disk, as the disk rotates, the failure detecting method comprising:
- a current detecting step of detecting a current value of a brake current flowing from the brake power supply to the multiple brake coils; and
- a failure identifying step of identifying a failed braking device of the braking devices, based on rotational positions of the rotary shafts of the multiple motors and the detected current value, wherein the failure identifying step determines whether or not the current value is greater than a threshold value, and when the current value is greater than the threshold value, identifies the failed braking device, based on the rotational positions of the rotary shafts of the multiple motors.

4. The failure detecting method according to claim 3, the failure identifying step determines whether each of the brake coils of the multiple braking devices is directly connected in series with the disk or is connected in series with the resistor, based on the rotational positions of the rotary shafts of the multiple motors, to thereby recognize a connection pattern of the brake coils of the multiple braking devices, and identifies the failed braking device, based on the recognized connection pattern and the current value.

5. A motor driving device for controlling braking of a plurality of motors each having a braking device by using a single brake power supply, wherein the braking device includes: an electromagnetic brake having a brake coil and configured to release braking of a rotary shaft of the motor by energizing the brake coil; a conductive disk configured to rotate together with the rotary shaft and connected in series with the brake coil; and a plurality of resistors provided on a surface of the disk so that the brake coil is periodically connected in series with each of the resistors, instead of the disk, as the disk rotates, the motor driving device comprising:
- a current detector configured to detect a current value of a brake current flowing from the brake power supply to the multiple brake coils; and
- a failure identifying unit configured to identify a failed braking device of the braking devices, based on rotational positions of the rotary shafts of the multiple motors and the detected current value, wherein the failure identifying unit is configured to determine whether each of the brake coils of the multiple braking devices is directly connected in series with the disk or is connected in series with the resistor, based on the rotational positions of the rotary shafts of the multiple motors, to thereby recognize a connection pattern of the brake coils of the multiple braking devices, and identify the failed braking device, based on the recognized connection pattern and the current value.

6. The motor driving device according to claim 5, wherein the failure identifying unit has a first threshold value corresponding to the braking device whose brake coil is connected to the resistor and a second threshold value corresponding to the braking device whose brake coil is directly connected to the disk, the second threshold value being different from the first threshold value, and the failure identifying unit is configured to identify, as the failed braking device, the braking device corresponding to a threshold value that is smaller than and closest to the current value, among the first and second threshold values.

7. The motor driving device according to claim 6, wherein:
- a resistance value of the resistors provided on the disk is different for each of the braking devices; and
- the first threshold value of the failure identifying unit comprises a plurality of different first threshold values that each correspond to the resistance value of the resistors provided on each of the disks of the multiple braking devices, and the failure identifying unit is configured to identify, as the failed braking device, the braking device corresponding to a threshold value that is smaller than and closest to the current value, among the multiple first threshold values and the second threshold value.

8. The motor driving device according to claim 7, wherein:
- a resistance value of the disk is different for each of the braking devices; and
- the second threshold value of the failure identifying unit comprises a plurality of different second threshold values that each correspond to the resistance value of each of the disks of the multiple braking devices, and the failure identifying unit is configured to identify, as the failed braking device, the braking device corresponding to a threshold value that is smaller than and closest to the current value, among the first and second threshold values.

9. The motor driving device according to claim 6, wherein:
- a resistance value of the disk is different for each of the braking devices; and
- the second threshold value of the failure identifying unit comprises a plurality of different second threshold values that each correspond to the resistance value of each of the disks of the multiple braking devices, and the failure identifying unit is configured to identify, as the failed braking device, the braking device corresponding to a threshold value that is smaller than and closest to the current value, among the first and second threshold values.

10. The motor driving device according to claim 5, wherein the failure identifying unit has a first threshold value corresponding to the braking device whose brake coil is connected to the resistor and a second threshold value corresponding to the braking device whose brake coil is directly connected to the disk, the second threshold value being greater than the first threshold value, and the failure identifying unit is configured to, if the current value is greater than the first threshold value and equal to or smaller than the second threshold value, identify the braking device whose brake coil is connected to the resistor, as the failed braking device, and if the current value is greater than the second threshold value, identify the braking device whose brake coil is directly connected to the disk, as the failed braking device.

11. A failure detecting method of, with a motor driving device configured to control braking of a plurality of motors each having a braking device by using a single brake power supply, detecting failure of the braking devices, wherein the braking device includes: an electromagnetic brake having a brake coil and configured to release braking of a rotary shaft of the motor by energizing the brake coil; a conductive disk configured to rotate together with the rotary shaft and connected in series with the brake coil; and a plurality of resistors provided on a surface of the disk so that the brake coil is periodically connected in series with each of the resistors, instead of the disk, as the disk rotates, the failure detecting method comprising:
 a current detecting step of detecting a current value of a brake current flowing from the brake power supply to the multiple brake coils; and
 a failure identifying step of identifying a failed braking device of the braking devices, based on rotational positions of the rotary shafts of the multiple motors and the detected current value, wherein the failure identifying step determines whether each of the brake coils of the multiple braking devices is directly connected in series with the disk or is connected in series with the resistor, based on the rotational positions of the rotary shafts of the multiple motors, to thereby recognize a connection pattern of the brake coils of the multiple braking devices, and identifies the failed braking device, based on the recognized connection pattern and the current value.

12. The failure detecting method according to claim 11, wherein the failure identifying step has a first threshold value corresponding to the braking device whose brake coil is connected to the resistor and a second threshold value corresponding to the braking device whose brake coil is directly connected to the disk, the second threshold value being different from the first threshold value, and the failure identifying step identifies, as the failed braking device, the braking device corresponding to a threshold value that is smaller than and closest to the current value, among the first and second threshold values.

13. The failure detecting method according to claim 12, wherein:
 a resistance value of the resistors provided on the disk is different for each of the braking devices; and
 the first threshold value of the failure identifying step comprises a plurality of different first threshold values that each correspond to the resistance value of the resistors provided on each of the disks of the multiple braking devices, and the failure identifying step identifies, as the failed braking device, the braking device corresponding to a threshold value that is smaller than and closest to the current value, among the multiple first threshold values and the second threshold value.

14. The failure detecting method according to claim 13, wherein:
 a resistance value of the disk is different for each of the braking devices; and
 the second threshold value of the failure identifying step comprises a plurality of different second threshold values that each correspond to the resistance value of each of the disks of the multiple braking devices, and the failure identifying step identifies, as the failed braking device, the braking device corresponding to a threshold value that is smaller than and closest to the current value, among the first and second threshold values.

15. The failure detecting method according to claim 12, wherein:
 a resistance value of the disk is different for each of the braking devices; and
 the second threshold value of the failure identifying step comprises a plurality of different second threshold values that each correspond to the resistance value of each of the disks of the multiple braking devices, and the failure identifying step identifies, as the failed braking device, the braking device corresponding to a threshold value that is smaller than and closest to the current value, among the first and second threshold values.

16. The failure detecting method according to claim 11, wherein the failure identifying step has a first threshold value corresponding to the braking device whose brake coil is connected to the resistor and a second threshold value corresponding to the braking device whose brake coil is directly connected to the disk, the second threshold value being greater than the first threshold value;
 if the current value is greater than the first threshold value and equal to or smaller than the second threshold value, the failure identifying step identifies the braking device whose brake coil is connected to the resistor, as the failed braking device; and
 if the current value is greater than the second threshold value, the failure identifying step identifies the braking device whose brake coil is directly connected to the disk, as the failed braking device.

\* \* \* \* \*